United States Patent

[11] 3,579,815

[72] Inventor Finis E. Gentry
Skaneateles, N.Y.
[21] Appl. No. 851,596
[22] Filed Aug. 20, 1969
[45] Patented May 25, 1971
[73] Assignee General Electric Company

[54] PROCESS FOR WAFER FABRICATION OF HIGH BLOCKING VOLTAGE SILICON ELEMENTS
17 Claims, 10 Drawing Figs.

[52] U.S. Cl. ........................................................ 29/580, 29/590, 148/175
[51] Int. Cl. ........................................................ B01j 17/00, H01l 5/00
[50] Field of Search ........................................... 29/580, 583, 590, 591, 578; 148/175; 317/47.1

[56] References Cited

UNITED STATES PATENTS

| | | | |
|---|---|---|---|
| 2,784,479 | 3/1957 | Roberts ........................ | 29/578 |
| 3,261,727 | 7/1966 | Dehmelt et al. .............. | 29/583 |
| 3,416,224 | 12/1968 | Armstrong et al. ........... | 29/580 |
| 3,430,109 | 2/1969 | Li ................................ | 317/234 |

*Primary Examiner*—John F. Campbell
*Assistant Examiner*—W. Tupman
*Attorneys*—Robert J. Mooney, Nathan J. Cornfeld, Carl O. Thomas, Frank L. Neuhauser, Oscar B. Waddell and Joseph B. Forman

ABSTRACT: A silicon wafer provided with at least one voltage-blocking junction is strengthened by epitaxially depositing silicon onto one major surface. The wafer is then etched to form grooved surfaces intersecting the junction. A passivation layer is deposited and fast diffusing impurities are gettered and removed. The wafer is broken into a plurality of discrete, separately useable silicon elements.

Figure 1A:
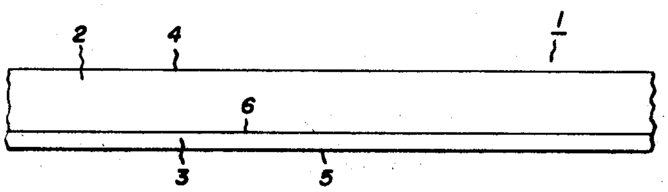

INVENTOR:
FINIS E. GENTRY,

BY Carl O. Thomas
HIS ATTORNEY.

INVENTOR:
FINIS E. GENTRY.

BY Carl O. Thomas
HIS ATTORNEY.

PROCESS FOR WAFER FABRICATION OF HIGH BLOCKING VOLTAGE SILICON ELEMENTS

My invention relates to a process for conveniently and efficiently providing silicon crystals or pellets for semiconductor devices which is suited to simultaneously processing many pellets within a single crystalline wafer and obtaining discrete pellets having improved voltage-blocking characteristics.

It is by now well understood how to manufacture semiconductor devices capable of blocking extremely high voltage differentials across their terminals. Unfortunately, the structural arrangements which result in the most desirable electrical characteristics have been largely limited in applicability to manufacturing approaches in which each semiconductive crystal or pellet to be incorporated into a semiconductor device is separately processed and handled.

Because of the extreme cost competitiveness of the semiconductor industry, manufacturing techniques have been developed capable of simultaneously processing semiconductive crystals or pellets for a large number of semiconductor devices while still associated within a single large crystalline disc or wafer. Wafer processing has greatly reduced the unit cost of semiconductive crystals and hence the cost of the semiconductor devices. However, the advantages of mass handling of semiconductive pellets are obtained only be accepting relatively low level electrical performance capabilities and by the necessity of rejecting substantial quantities of completed semiconductor devices due to semiconductive crystal damage produced in fabrication. For example, whereas four-layer, three-junction thyristor pellets can be individually manufacture capable of reliably providing semiconductor devices capable of blocking terminal-applied potentials well in excess of 1,000 volts, thyristors having semiconductive crystals formed and processed en masse typically exhibit voltage-blocking characteristics well below 400 volts. This is no disadvantage to applications requiring low blocking voltage capabilities, but, obviously, the range of applications for such devices are limited by this parameter. Further, a substantial number of the semiconductor devices produced by such mass handling techniques must be discarded or downgraded as failing to meet even these modest performance criteria due to mechanical damage in processing and assembly.

It is an object of my invention to provide a process suitable for simultaneously fabricating silicon pellets from a single silicon wafer in which the wafer can be more easily processed without damage and pellets formed which exhibit improved blocking voltage characteristics.

This and other objects of my invention are in one aspect accomplished by a process of forming from a single silicon crystal wafer a plurality of separate silicon crystal elements in which a silicon crystal wafer is formed having a first zone adjacent a first major surface, a second zone adjacent a second major surface, and a junction interposed between the zones. A layer is epitaxially deposited onto the second major surface having a conductivity type corresponding to that of the second zone and a thickness of at least 2 mils. The silicon wafer is grooved through the first major surface to a depth nearer the second major surface than the depletion layer of maximum width contemplated to be associated with the junction to divide the first zone and at least a portion of the second zone into sectors while the epitaxial layer remains unitary. A passivation layer is formed over the exterior surface of the silicon wafer including the groove surfaces intersecting the junction while the wafer is heated. Fast diffusing impurities are gettered and removed from the wafer, and a portion of the passivation layer is removed from the epitaxial layer and the first major surface. Ohmic contacts are attached to the exposed silicon wafer surfaces, and the silicon crystal wafer is subdivided through the epitaxial layer portion underlying the groove trough areas to form separately useable silicon crystal elements or pellets each including a sector of each zone.

According to a preferred practice of my inventive process, gettering may be accomplished by forming a stressed region on a surface of the silicon crystal. By heating the crystal to form a passivating layer dislocations are formed in the stressed region which act as traps for fast diffusing impurities, such as iron. Removal of the stressed regions from the silicon crystal thereby removes the trapped or gettered impurities and contributes to improved voltage-blocking characteristics for the silicon elements formed.

Figure 1B:
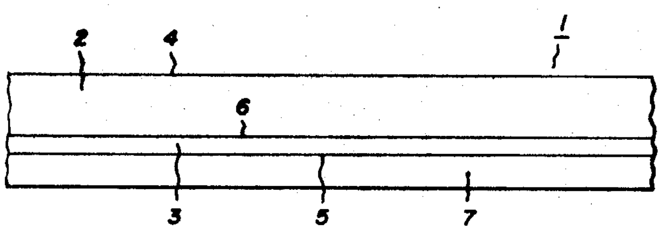
Figure 1C:
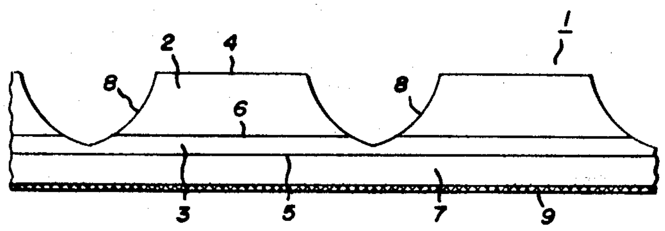
Figure 1D:
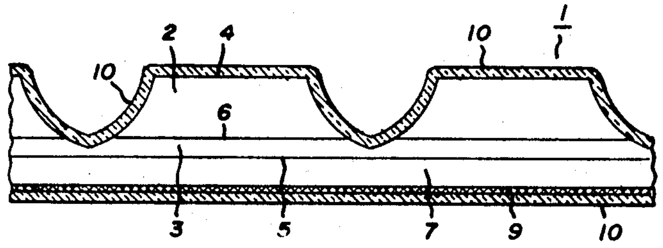
Figure 1E:
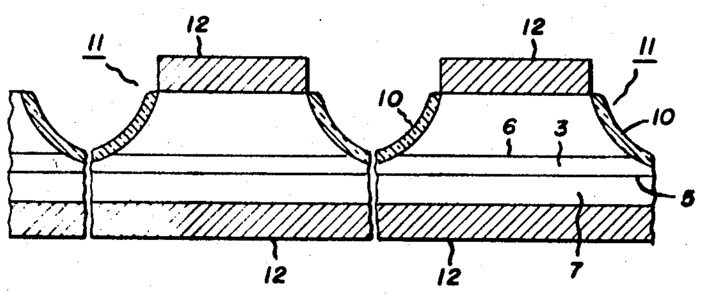

My invention may be better understood by reference to the following detailed description considered in conjunction with the drawings, in which:

FIGS. **1*a*–1*e* inclusive are sectional schematic details illustrating various stages of fabricating a silicon semiconductor diode according to my invention, FIG. 1*a* depicting a silicon crystalline wafer formed of first and second zones, FIG. 1*b* depicting the silicon crystalline wafer with an epitaxial layer deposited onto the second zone, FIG. 1*c* depicting the silicon wafer with the first and second zones grooved and the epitaxial layer stressed over its outer surface, FIG. 1*d* depicting the silicon wafer after heating with a passivation layer overlying the exterior crystal surfaces, and FIG. 1*e* representing a plurality of separately useable silicon diode crystals with contact metallization associated incorporating silicon pellets from the wafer; and FIGS. 2*a*–2*e* inclusive are sectional schematic details comparable to FIGS. 1*a*–1*e*** inclusive illustrating various stages of fabricating a silicon-controlled rectifier thyristor according to my invention.

In the practice of my process, I utilize as a starting substrate a silicon crystalline wafer which may be of either P or N conductivity type. Where it is desired to form silicon diode elements or pellets from the wafer, an impurity of an opposite conductivity type may be diffused into the wafer to form a P–N rectifying junction therein. Since it is desired to form many separately useable pellets from a single wafer, the wafer is typically of large diameter as compared to its thickness. For example, silicon wafers produced by float zone processing are typically 1 to 2 inches in diameter and 4 to 10 mils in thickness, or alternately stated, the diameter to thickness ratios for these wafers range from 100:1 to 500:1. Such thin silicon wafers are quite brittle and, unless carefully handled in processing according to conventional techniques, may be mechanically damaged. In FIG. **1*a* a wafer 1 is shown consisting of a first zone 2 of a first conductivity type and a second zone 3 of an opposite conductivity type. Initially the wafer may be formed entirely of the first zone and the second zone formed by diffusing an impurity type opposite to that of the first zone. In such instance the first zone exhibits a higher resistivity than the second zone. The first zone lies adjacent a first major surface 4 while the second zone lies adjacent a second, opposed major surface 5. A junction 6** lies between the zones.

My invention is applied with particular advantage to processing large-diameter thin wafers, since at the outset I epitaxially deposit onto one major surface of the wafer an additional layer of monocrystalline silicon which is of a conductivity type corresponding to that of a diffused zone within the wafer. Looking at FIG. **1*b* it can be seen that an epitaxial layer 7 is deposited onto the second major surface of the crystal so that it in effect increases the thickness of the second zone, which is of like conductivity type. The advantage of the epitaxial layer is that it provides a very rapid method of increasing the thickness of the wafer and hence its strength. At the same time, however, the junction 6 is spaced from the wafer interface with the epitaxial layer so that it is not adversely affected by the crystal defects characteristic of the interface between an epitaxial layer and its substrate. An additional advantage of the epitaxial layer is that the junction 6** is moved further away from the major exterior surfaces of the wafer. Removing the junction of comparable distance from the exterior surfaces of the wafer by diffusion techniques alone would be comparatively time consuming. Although I prefer to utilize conventional thin wafers as substrates for the deposition of epitaxial layers, it is, of course, recognized that since the wafer substrate to be utilized is at the outset of my process strengthened by the addition of an epitaxial layer, the substrate may be somewhat thinner than would be practical using conventional processing. It is generally necessary that the epitaxial layer have a thickness of at least 2 mils in order to offer sufficient strength to the wafer to avoid damage in subsequent handling during processing.

After the epitaxial layer is deposited, the wafer is grooved from the first major surface to adjacent the epitaxial layer. The grooves may be formed in any conventional pattern and manner. In order to achieve the maximum utilization of silicon the grooves are typically formed in perpendicularly intersecting sets of parallel, rectilinear grooves resulting in an intersecting grid pattern. Other groove patterns such as tangentially impinging annular grooves, hexagonal grooves, etc., are possible. The grooves may be formed mechanically by lapping or grinding, but are preferably formed by etching. Etched grooves are particularly advantageous in that they allow positive beveling as is explained more fully below. The grooves may terminate short of the epitaxial layer or extend into this layer. It is generally preferred that the grooves stop short of the epitaxial layer in order to prevent unnecessary mechanical weakening of this layer. The grooves divide the first zone and at least a portion of the second zone into sectors. In FIG. 1*c* the first zone of the silicon crystal is shown provided with a plurality of etched grooves 8.

The epitaxial layer is shown in FIG. 1*c* provided with a stressed region 9. The purpose of the stressed region is to provide a source of gettering sites or traps for fast diffusing impurities such as iron. The region 9 need extend only a very slight distance into the silicon and is typically confined to a few microns in depth. Stressing may be accomplished by mechanically abrading the surface of the wafer. For example, the surface of the crystal may be sandblasted or lapped. Instead of mechanically stressing the surface of the epitaxial layer, relatively slow diffusing impurity atoms may be introduced into the second zone to introduce crystal lattice defects that will act as impurity traps. For example, where the epitaxial layer is formed of P-type silicon, boron is particularly suited to forming a stressed surface region by substitutional diffusion; for N-type silicon phosphorus may be used. It is immaterial whether the stressed region is formed before or after grooving.

The exterior surfaces of the grooved wafer are coated with a conventional passivation layer, such as an oxide layer. Oxide formation is typically achieved within the temperature range of from 900 to 1,200° C. As is well understood the thickness of the oxide layer formed is a function of the time and temperature of heating and the character of the oxidant used. The presence of moisture in the oxidizing atmosphere increases the rate of formation of the oxide layer above that for a substantially dry oxidizing atmosphere. It may be desirable to purge the oxidizing atmosphere and cool the surface oxidized silicon crystal in an atmosphere of a dry gas such as dry oxygen or argon, so as to remove any traces of water vapor from the silicon dioxide layer, thereby producing a more stable oxide layer. As employed herein the term "passivation layer" refers to the ability of this layer to improve the stability of the electrical properties of the silicon crystal over observed stability levels when the surface of the silicon is exposed to the ambient environment. Even very thin oxide layers of only a few thousand angstroms improve stability. While it is possible to grow relatively thick oxide layers in the range of 20,000 to 30,000 angstroms, it is contemplated that the passivation will be supplemented in stabilizing the electrical properties of the silicon crystal by the use of known crystal encapsulation techniques. Accordingly, it is unnecessary and usually not desirable that the oxide layer be of sufficient thickness to itself fully stabilize the silicon crystal.

Simultaneous with formation of the passivation layer by heating, the stressed regions associated with the epitaxial layer are converted to crystal dislocations that relieve the stress. These crystal dislocations serve as traps within the crystal lattice for fast diffusing impurities such as iron that can be detrimental to the electrical performance of the crystal even when present in quantities well below 1 part per million. At temperatures above 900° C. the crystal is sufficiently plastic to allow such traps to form. The duration of heating is not critical to the gettering of fast diffusants, since usually the heating period to form a passivation layer by conventional oxidation techniques will set the minimum acceptable heating time. To achieve success in gettering, however, gradual cooling of the silicon crystal must occur. While the cooling rate may vary widely without adverse effect, it should at all times be maintained below the cooling rate for quenching. A normal oven cooling rate of about 250° C. per hour has been found quite successful.

In FIG. 1*d* the silicon wafer is schematically shown as it appears immediately after heating according to my invention. An oxide layer 10 covers the exterior surfaces of the wafer. In FIG. 1*e* a plurality of discrete, separately useable rectifier diode assemblies 11 are shown formed from the portion of the wafer shown in FIG. 1*d*. As an initial step toward converting the wafer to discrete assemblies the oxide layer covering the epitaxial layer together with the stressed region 9 having crystal dislocations and trapped fast diffusing impurities therein are removed from the wafer by conventional techniques, such as etching or mechanical abrasion. The oxide layer is also removed from the ungrooved surfaces of the first zone. Contact metallization 12 is then located over the exposed silicon wafer areas. The contact metallization may be any conventional contact layer or combination of contact layers capable of forming an ohmic contact with the silicon crystal. Thereafter the wafer may be subdivided into separate elements as by scribing or sawing the crystal through the groove troughs. The resultant rectifier diode assemblies may be mounted and packaged for use according to conventional techniques.

My process offers a number of distinct advantages over conventional wafer processing techniques. While the advantages of processing many separately useable silicon semiconductor elements simultaneously are retained so that the individual handling of pellets is minimized, I avoid the principal disadvantages of wafer processing—namely, difficulty in handling fragile wafers and obtaining pellets of quite limited voltage-blocking characteristics.

By associating an epitaxial layer with the silicon crystalline wafer at an early stage of processing, I strengthen the wafer and obviate mechanical damage in handling. The epitaxial layer is particularly advantageous in that it can be laid down quickly as compared with crystal layers of comparable thickness formed by diffusion techniques. At the same time the epitaxial layer does not adversely affect voltage-blocking characteristics as would occur, for example, if the junction were located at the interface of the epitaxial layer and the original substrate. Such interfaces inherently contain numerous crystal defects which render attainment of high blocking voltages difficult. According to my technique, the voltage-blocking junction is located within the initial substrate displaced from the epitaxial layer substrate interface by a distance sufficient to more than offset the expected spreading of the depletion layer. This insures that the depletion layer is at all times spaced from this interface, even when the maximum contemplated voltage to be blocked is applied across the crystal.

By passivation of the grooved surfaces of the pellets adjacent their intersection with the periphery of the blocking junction I stabilize the pellets against surface breakdown. In the preferred form of my invention the grooves are formed by etching so that the intersection of the blocking junction and the grooved edge of the pellet is positively beveled. This increases the voltage-blocking capabilities of the junction, since beveling is well known to have the ability to spread the field gradient at the surface of the silicon crystal so that the maximum voltage-blocking capabilities are increased. But even if the reverse breakdown voltage is reached, breakdown will occur through the bulk of the crystal in a nondestructive manner rather than through destructive surface breakdown. It is, of course, recognized that not all beveling inherently improves voltagedblocking characteristics. Note, for example, the article *Control of Electric Field at the Surface of P–N Junction* by R. L. Davies and F. E. Gentry, published July, 1964, in the IEEE Transactions on Electron Devices. Negative bevels may actually be detrimental, unless carefully controlled within a rather narrow range of bevel angles, usually from about 4° to 12°. It is to be noted that in my process by etching through the first zone, which is of higher resistivity, toward the second major surface I provide blocking voltage improving positive bevel angles. Thus, there is no necessity of critically controlling the final depth of the groove and hence its angle of intersection with the blocking junction, since all positively beveled surfaces are to some extent advantageous in achieving field spreading at the junction. On the other hand, where very high voltage-blocking characteristics are desired, the groove depth may be related to the junction to produce the desired voltage-blocking characteristics. Where the junction intersects the grooves adjacent the groove troughs a very shallow positive bevel angle is present at the intercept of the groove surfaces with the junction that has a very desirable field-spreading effect.

The stabilizing effect of the passivation layer together with the positively beveled groove surfaces protects the pellets against destructive surface breakdown and allows breakdown to occur by avalanche through the bulk of the silicon crystal. But without gettering of fast diffusing impurities only modest bulk breakdown levels could be achieved. By gettering and removing fast diffusing impurities as may enter the crystal during heating to form the passivation layer I obtain pellets that are capable of blocking elevated voltages. By stressing the region of the epitaxial layer that is remote from the second major surface and hence the junction of the crystal I insure that the gettered impurities are located at a remote location from the junction. Further, by utilizing a surface of the epitaxial layer that is substantially parallel to the junction I insure that all the pellets formed have roughly comparable blocking voltages. By forming the crystal dislocations and gettering during the step of heating to form the passivation layer I advantageously combine gettering with the remainder of my process so that only a minimal effort is required in order to trap and remove fast diffusing impurities.

While I have disclosed my invention with reference to the fabrication of a number of silicon rectifier diode assemblies from a single silicon crystal according to a preferred practice, it is appreciated that this represents only an exemplary form of my invention. For example, instead of depositing the epitaxial layer onto the substrate after positioning of the junction, as is preferred, the junction may be diffused into the substrate after the epitaxial layer is deposited. Instead of etching grooves in the silicon crystal grooves may be mechanically formed by lapping or other abrading techniques.

Figure 2A:
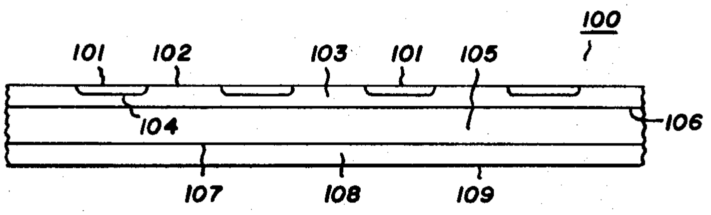

My invention is, of course, well suited to the formation of silicon pellets for use in semiconductor devices other than diodes. For example, in FIGS. 2*a*–2*e* inclusive I illustrate a generally comparable, although somewhat more complex, process for forming a silicon-controlled rectifier of improved voltage-blocking characteristics according to my invention. As shown in FIG. 2*a* a substrate 100 is provided with an interrupted first zone 101 lying adjacent a first major surface 102. A second zone 103 of opposite conductivity type separates the first zone and extends to the first major surface between the first zone. The first and second zones form a first junction 104 therebetween. A third zone 105 lies interiorly of the silicon wafer and forms a second junction 106 with the second zone and a third junction 107 with a fourth zone 108 of opposite conductivity type lying adjacent a second major surface 109. The first and third zones differ in conductivity type from the second and fourth zones. The zones may be formed within a silicon crystal by any conventional technique. For example, all of the junctions may be simultaneously formed by exposing the wafer to gallium arsenide with oxide layers over all exterior surfaces other than those adjacent the first zone. In such instance the crystal would initially be of a conductivity type corresponding to that of the third zone—namely, N-type conductivity.

Figure 2B:
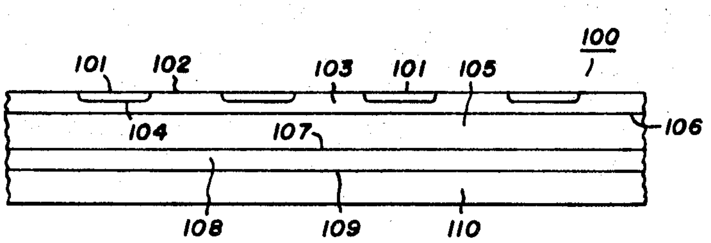
Figure 2C:
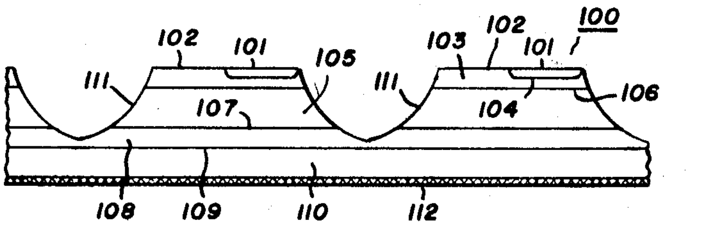
Figure 2D:
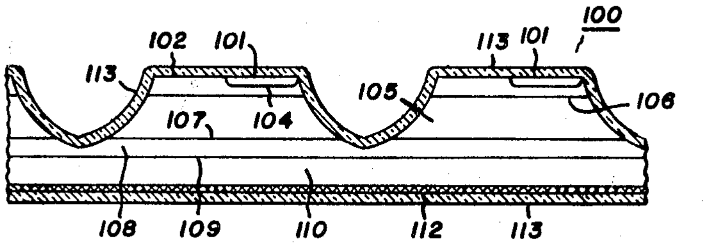
Figure 2E:
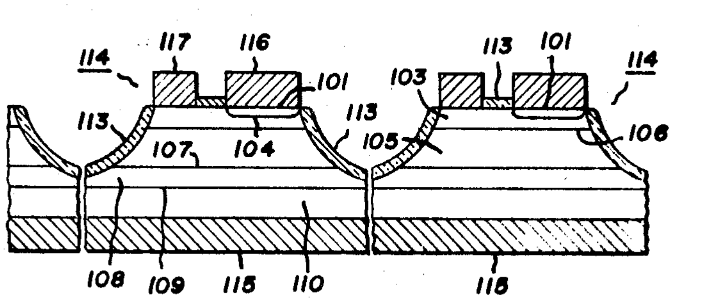

As shown in FIG. 2*b* an epitaxial layer 110 is deposited over the second major surface. The epitaxial layer corresponds to the conductivity type of the fourth zone. In FIG. 2*c* the wafer is illustrated after grooves are etched from the first major surface to a point adjacent the epitaxial layer. It is to be noted that the grooves divide the first, second, and third zones and at least a portion of the fourth zone into sectors. A stressed region 112 is shown associated with the epitaxial layer. In FIG. 2*d* a passivation layer 113 is shown covering the exterior surfaces of the wafer. In FIG. 2*e* a plurality of thyristor assemblies 114 are shown formed from grooved sectors of the silicon wafer. The stressed region 112 together with crystal dislocations and gettered fast diffusing impurities are removed from the epitaxial layer and replaced by contact metallization 115, which forms an ohmic contact with the silicon crystal. The passivation layer is removed from a portion of the first major surface and contact metallization 116 is deposited over the sectors of the first zone while contact metallization 117 is deposited over a portion of the second zone adjacent the first major surface. The contacts 115, 116, and 117 allow for connection of anode, cathode, and gate terminals. It is to be specifically noted that the voltage-blocking junctions 106 and 107 peripherally intersect the beveled and passivated portion of the crystal surfaces—thus, an outstanding ability to block voltages is retained by the individual assemblies, despite manufacture from a single wafer. The third junction 107 is noted to be positively beveled near the trough of the grooved surfaces so that a shallow positive bevel angle is present while the second junction, although negatively beveled is beveled at quite a steep angle—nearly 90°—thereby minimizing the effect of adverse beveling. It is noted that the process steps described more fully in connection with the fabrication of rectifier diode assemblies are generally applicable to the fabrication of thyristor assemblies according to my invention. Accordingly detailed redescription of the process steps in connection with thyristor assembly fabrication is thought unnecessary, except as set forth above.

What I claim and desire to secure by Letters Patent of the United States is:

1. A process of forming from a single silicon crystal wafer a plurality of separate silicon crystal elements comprising forming a silicon crystal wafer having a first zone adjacent a first major surface, a second zone adjacent a second major surface, and a junction interposed between the zones, epitaxially depositing onto the second major surface a layer having a conductivity corresponding to that of the second zone and a thickness of at least 2 mils, grooving the silicon wafer through the first major surface to a depth nearer the second major surface than the depletion layer of maximum width contemplated to be associated with the junction to divide the first zone and at least a portion of the second zone into sectors while the epitaxial layer remains unitary, forming a passivation layer over the exterior surface of the silicon wafer including the groove surfaces intersecting the junction while the wafer is heated, gettering and removing fast diffusing impurities from the wafer, removing the passivation layer from a portion of the epitaxial layer and the first major surface, attaching ohmic contacts to the exposed silicon wafer surfaces, and subdividing the silicon crystal wafer through the epitaxial layer portion underlying the groove trough areas to form separately useable silicon crystal elements each including a sector of each zone.

2. A process according to claim 1 in which the gettering and removing of impurities is performed by forming a stressed region on a surface of the epitaxial layer of the silicon wafer, relieving stresses during heating to form crystal dislocations capable of acting as traps for fast diffusing impurities, and removing the impurity-containing region prior to attaching ohmic contacts.

3. A process according to claim 2 in which the step of forming a stressed region is accomplished by mechanically abrading the epitaxial layer.

4. A process according to claim 2 in which the step of forming a stressed region is accomplished by substitutional diffusion with impurity atoms.

5. A process according to claim 1 in which the silicon wafer is heated in an oxidizing atmosphere.

6. A process according to claim 1 in which the silicon wafer is cooled after heating within a dry atmosphere.

7. A process according to claim 1 in which the junction lies between and contiguous with the first and second zones, the resistivity of the first zone is greater than that of the second zone, and the wafer is grooved by etching so that the junction intersections with the groove surfaces are positively beveled to increase the voltage-blocking capabilities of the silicon crystal elements.

8. A process according to claim 1 in which the wafer is grooved by etching to a depth so that the junction intercepts the groove surfaces adjacent the groove trough areas.

9. A process according to claim 1 in which the wafer is grooved by etching so that the groove trough areas are spaced from the epitaxial layer.

10. A process of forming from a single silicon crystal wafer a plurality of separate silicon crystal elements for use in thyristors comprising

- forming a silicon crystal wafer with an interrupted first zone adjacent a first major surface and a fourth zone adjacent an opposed major surface with second and third zones interposed between the first and fourth zones, the first and third zones being of a first conductivity type and the second and fourth zones being of an opposite conductivity type, the second zone extending to the first major surface through spaced interruptions in the first zone, the first and second zones forming a first junction therebetween, the second and third zones forming a second junction therebetween, and the third and fourth zones forming a third junction therebetween,
- epitaxially depositing onto the opposed major surface a layer having a conductivity type corresponding to that of the fourth zone and a thickness of at least 2 mils,
- grooving the silicon crystal wafer from the first major surface to a depth nearer the opposed major surface than the depletion layer of maximum width contemplated to be associated with the third junction so that the first, second and third zones and at least a portion of the fourth zone are divided into sectors while the epitaxial layer remains unitary,
- forming a passivation layer over the exterior surface of the silicon wafer including the groove surfaces intersecting the junction while the wafer is heated,
- gettering and removing fast diffusion impurities from the wafer,
- removing the passivation layer from a portion of the epitaxial layer and the first major surface,
- attaching ohmic contacts to the exposed silicon wafer surfaces, and
- subdividing the silicon crystal wafer through the epitaxial layer portion underlying the groove trough areas to form separately useable silicon crystal elements each including a sector of each zone.

11. A process according to claim 10 in which the gettering and removing of impurities is performed by forming a stressed region on a surface of the epitaxial layer of the silicon wafer, relieving stresses during heating to form crystal dislocations capable of acting as traps for fast diffusing impurities, and removing the impurity-containing region prior to attaching ohmic contacts.

12. A process according to claim 11 in which the step of forming a stressed region is accomplished by mechanically abrading the epitaxial layer.

13. A process according to claim 11 in which the step of forming a stressed region is accomplished by substitutional diffusion with impurity atoms.

14. A process according to claim 10 in which the silicon wafer is heated in an oxidizing atmosphere.

15. A process according to claim 10 in which the silicon wafer is cooled after heating within a dry atmosphere.

16. A process according to claim 10 in which the silicon wafer is grooved by etching from the first major surface to a depth adjacent the epitaxial layer to positively bevel the third junction.

17. A process according to claim 10 in which the silicon wafer is grooved by etching so that the third junction intercepts the grooves adjacent the trough areas.